(12) United States Patent
Jin (10) Patent No.: US 12,207,403 B2
(45) Date of Patent: Jan. 21, 2025

(54) PLATFORM SUPPORTS THE SHORTEST ELECTRICAL CONNECTION BETWEEN TWO QSFP DD TRANSCEIVERS

(71) Applicant: Shuang Jin, Dublin, CA (US)

(72) Inventor: Shuang Jin, Dublin, CA (US)

( * ) Notice: Subject to any disclaimer, the term of this patent is extended or adjusted under 35 U.S.C. 154(b) by 447 days.

(21) Appl. No.: 17/555,499

(22) Filed: Dec. 19, 2021

(65) Prior Publication Data

US 2023/0199950 A1    Jun. 22, 2023

(51) Int. Cl.
*H05K 1/11*    (2006.01)
*H05K 1/18*    (2006.01)

(52) U.S. Cl.
CPC ............. *H05K 1/111* (2013.01); *H05K 1/181* (2013.01); *H05K 2201/09409* (2013.01); *H05K 2201/09672* (2013.01); *H05K 2201/10189* (2013.01); *H05K 2201/10545* (2013.01)

(58) Field of Classification Search
CPC .............. H05K 1/111; H05K 1/181; H05K 2201/09409; H05K 2201/09672; H05K 2201/108189; H05K 2201/108545
USPC ........................................................ 439/83
See application file for complete search history.

(56) References Cited

U.S. PATENT DOCUMENTS

| | | | |
|---|---|---|---|
| 9,608,377 B1* | 3/2017 | Phillips | H01R 13/7172 |
| 10,791,629 B1* | 9/2020 | Ren | H05K 3/303 |
| 11,102,878 B1* | 8/2021 | Chandra | H05K 1/0245 |
| 2018/0277973 A1* | 9/2018 | Regnier | H01R 13/6583 |
| 2019/0208633 A1* | 7/2019 | Wen | H05K 3/4623 |
| 2020/0053882 A1* | 2/2020 | Han | H01R 12/58 |
| 2021/0051099 A1* | 2/2021 | Iwasaki | H04L 49/109 |
| 2021/0076495 A1* | 3/2021 | Ren | H05K 1/115 |

FOREIGN PATENT DOCUMENTS

| | | | | | |
|---|---|---|---|---|---|
| CN | 112821103 A | * | 5/2021 | .......... | H01R 12/716 |
| EP | 3675606 A1 | * | 7/2020 | .......... | H01R 31/005 |

* cited by examiner

*Primary Examiner* — Peter G Leigh (57) ABSTRACT

Two QSFP-DD transceivers' footprints are placed on the opposite sides of a PCB board. The two footprints are aligned in a special way and the connections among the pads of the two footprints are also specially defined. Based on that, the pads of the two footprints are connected through PCB traces and VIA. Two QSFP-DD electrical connectors are soldered onto the two footprints. So the high-speed signals from two QSFP-DD transceivers are directly connected in the shortest way when the two transceivers are plugged into the two QSFP-DD connectors.

4 Claims, 8 Drawing Sheets

PLATFORM SUPPORTS THE SHORTEST ELECTRICAL CONNECTION BETWEEN TWO QSFP DD TRANSCEIVERS

FIELD OF APPLICATION OF THIS INVENTION

Telecommunication and Data communication industries' R&D, Testing and Production.

BACKGROUND

QSFP-DD transceivers are broadly applied in the Telecommunication and Data communication industry for exchange of information over distances. The interconnections in those applications are all about transceivers to host system and host system to transceivers. However, the connections directly between QSFP-DD transceivers are less discussed and even less interested. Nevertheless, the way to support direct electrical connections between two transceivers is very potential to establish a fundamental platform, on which new applications will be developed and existing design may be leveraged by using it. This invention will present what the fundamental platform looks like and how it can implements the adjustable length to shortest and all uniform length electrical connections for all the high-speed signals coming from two QSFP-DD transceivers.

SUMMARY OF THE INVENTION

In order to achieve the best performance electrical connection between high-speed signals coming from two QSFP-DD transceivers, the two transceivers need to be plugged into two QSFP-DD electrical connectors mounted on the opposite sides of a PCB board. The two QSFP-DD electrical connectors are soldered or epoxied onto their footprints. Each footprint of the two electrical connectors consists of numbers of pads and some of them are defined as high-speed signals. The two footprints are individually placed on different sides of the PCB and aligned as the way that all adjacent pads are lined up and spaced evenly if looking through transparent view from either side of the PCB. Adjustable length PCB traces and VIA are used to implement the connection of each pair of specially mated pads, which are individually located on the opposites of the PCB board. Therefore, the high-speed signals coming from the two transceivers are connected through the electrical connectors, footprints' pads, adjustable length PCB traces and VIA.

Overall, this invention is about a platform, which enables the accomplishment of direct, uniform and shortest electrical connections for all the high-speed signals coming from two QSFP-DD transceivers. This utility of the special way of making the connections between two QSFP-DD electrical connectors distinguishes the solution having adjustable length to the shortest capability, taking minimum space and no need any RF cables.

DESCRIPTION OF THE EMBODIMENT

Figure 1:
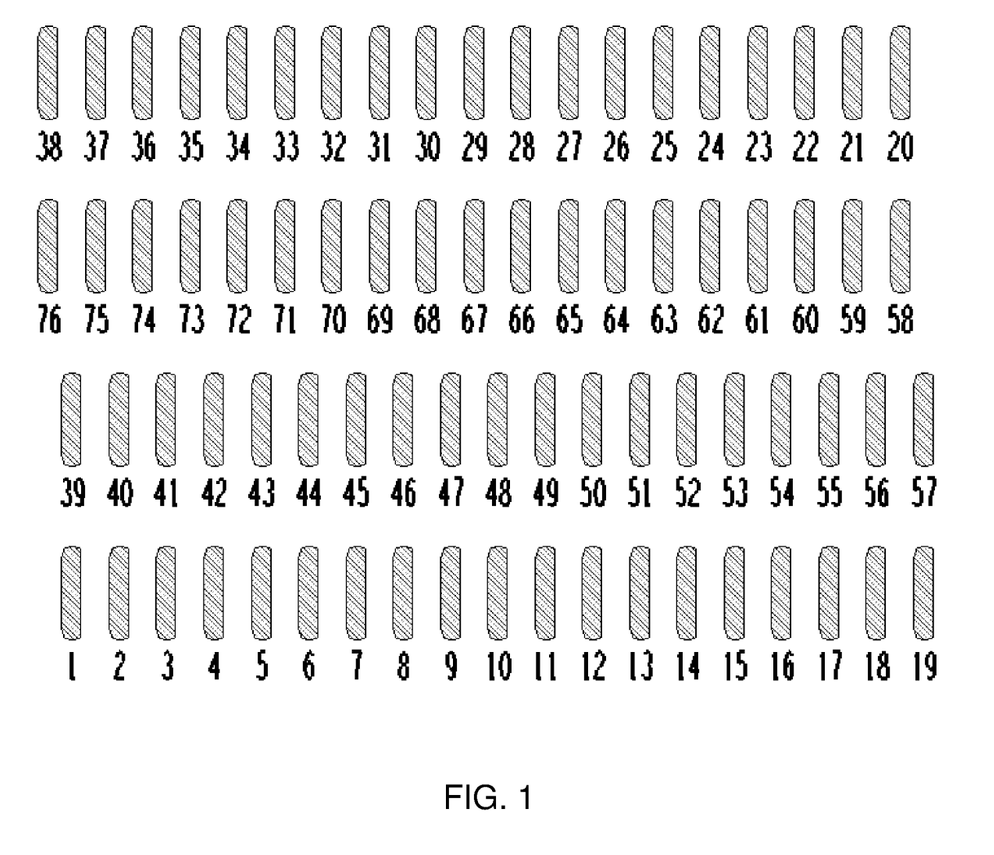
FIG. 1 is a drawing of QSFP-DD electrical connector's footprint on top side of a PCB (Top view).
2.
Figure 2:
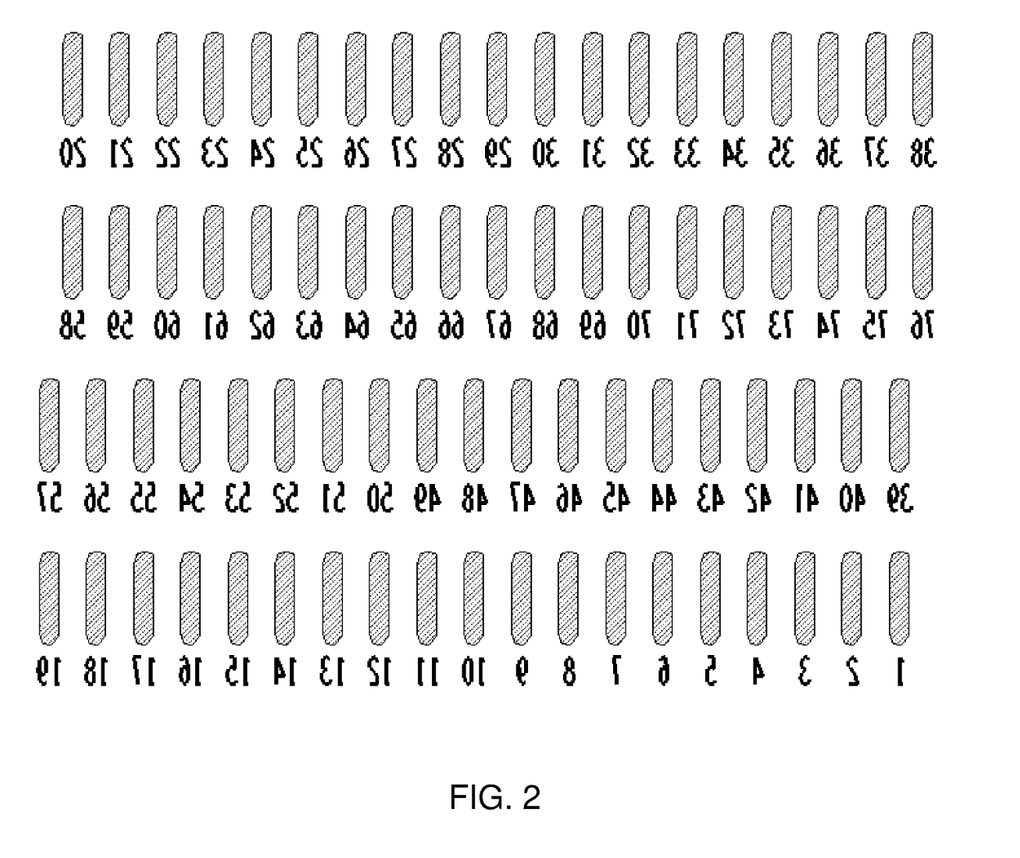
FIG. 2 is a drawing of QSFP-DD electrical connector's footprint on bottom side of a PCB (Top transparent view).
3.
Figure 3:
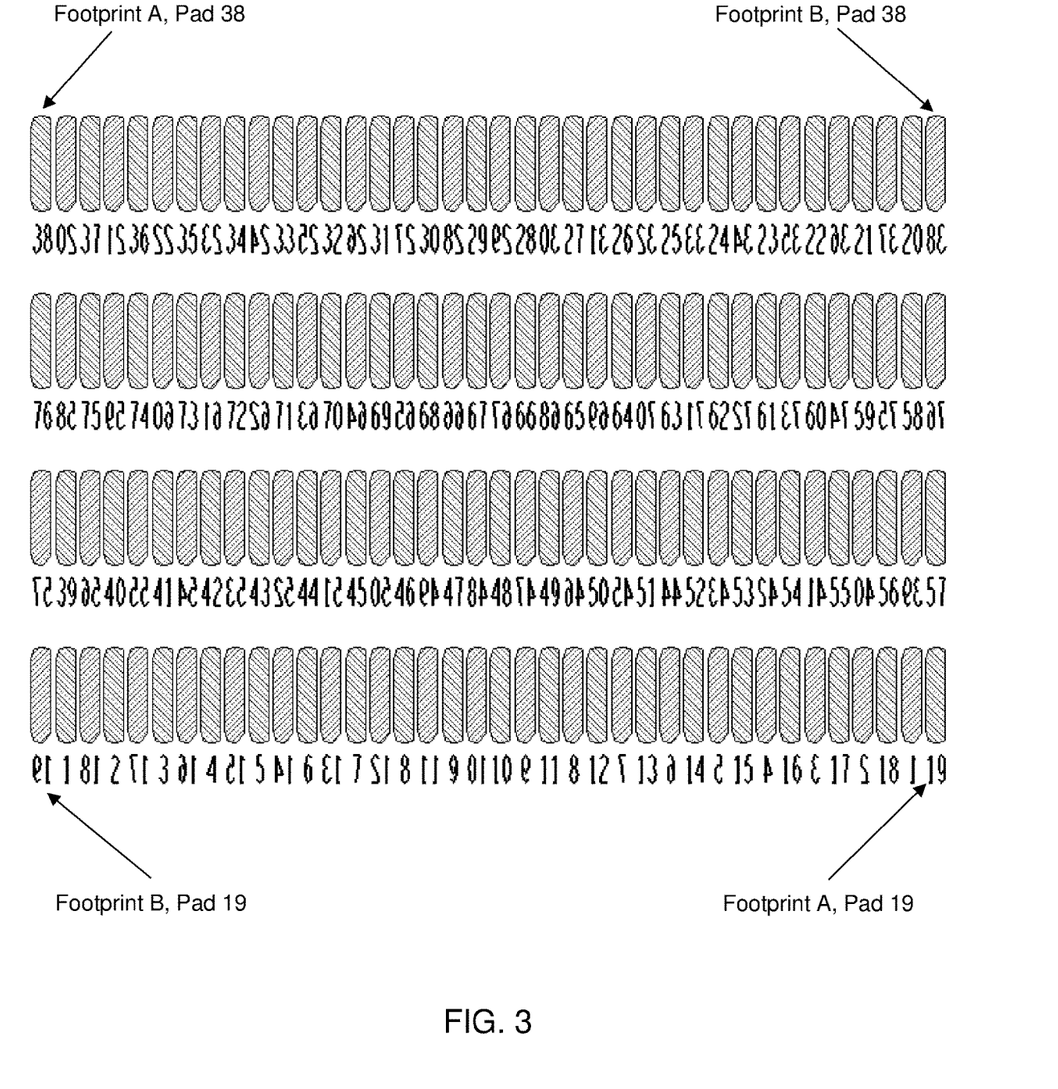
FIG. 3 is the drawing of two QSFP-DD electrical connectors' footprints placed on different sides of a PCB and aligned in a special way (Top transparent view).
4.

1. QSFP-DD electrical connector's PCB footprint on the top side of a PCB board is shown in FIG. 1 (Top View). There are 76 soldering pads in the footprint. Each pad is assigned a unique number to stand for the physical location of the pad in the footprint.
2. The Connector's PCB footprint's some soldering pads are defined as high-speed signals and GND signals, and the pads' pin assignments are shown in Table 1. The numbers in the Table 1 are corresponding to the footprint's pads' numbers and stand for the physical locations of the soldering pads as shown in FIG. 1.
3. QSFP-DD connector's PCB footprint on the bottom side of a PCB board is shown in FIG. 2 (Top Transparent View). There are 76 soldering pads in the footprint. Each pad is assigned a unique number to stand for the physical location of the pad in the footprint.
4. The Connector's PCB footprint's some soldering pads are defined as high-speed signals and GND signals, and the pads' pin assignments are shown in Table 2. The numbers in the Table 2 are corresponding to the footprint's pads' numbers and stand for the physical locations of the soldering pads as shown in FIG. 2.
5. As shown in FIG. 3, QSFP-DD electrical Connector A's footprint Footprint A (with pads shaded with backslash lines) is placed on top side of a PCB board, and QSFP-DD electrical Connector B's footprint Footprint B (with pads shaded with forward slash lines) is placed on the bottom side of the same PCB board. Perpendicularly looking at transparent view from top side of the PCB board, the two footprints are aligned as the way that all adjacent pads are lined up and spaced evenly. The pads shaded with backslash lines are from Footprint A on top side of the PCB board, and the pads shaded with forward slash lines are from Footprint B on the bottom side of the PCB board. The numbers below the pads are the pad-numbers (pin numbers) as shown in FIG. 1 and FIG. 2.

6. As shown in FIG. 1 and Table 1, Footprint A has high-speed and GND signals, and as shown in FIG. 2 and Table 2, Footprint B also has high-speed and GND signals; And the connections between the high-speed signals from the two footprints are defined in Table 3. In Table 3, the numbers shaded with backslash lines are from Footprint A and the numbers shaded with dots are from the Footprint B. The numbers shaded with horizontal lines are from Footprint A, and the numbers shaded with vertical lines are from Footprint B. The connection mappings are as the followings:

Footprint A's pad 2 is connected to Footprint B's pad 56,
Footprint A's pad 3 is connected to Footprint B's pad 55,
Footprint A's pad 5 is connected to Footprint B's pad 53,
Footprint A's pad 6 is connected to Footprint B's pad 52,
Footprint A's pad 14 is connected to Footprint B's pad 44,
Footprint A's pad 15 is connected to Footprint B's pad 43,
Footprint A's pad 17 is connected to Footprint B's pad 41,
Footprint A's pad 18 is connected to Footprint B's pad 40,
Footprint A's pad 21 is connected to Footprint B's pad 75,
Footprint A's pad 22 is connected to Footprint B's pad 74,
Footprint A's pad 24 is connected to Footprint B's pad 72,
Footprint A's pad 25 is connected to Footprint B's pad 71,
Footprint A's pad 33 is connected to Footprint B's pad 63,
Footprint A's pad 34 is connected to Footprint B's pad 62,
Footprint A's pad 36 is connected to Footprint B's pad 60,
Footprint A's pad 37 is connected to Footprint B's pad 59,
Footprint A's pad 40 is connected to Footprint B's pad 18,
Footprint A's pad 41 is connected to Footprint B's pad 17,
Footprint A's pad 43 is connected to Footprint B's pad 15,
Footprint A's pad 44 is connected to Footprint B's pad 14,
Footprint A's pad 52 is connected to Footprint B's pad 6,
Footprint A's pad 53 is connected to Footprint B's pad 5,
Footprint A's pad 55 is connected to Footprint B's pad 3,
Footprint A's pad 56 is connected to Footprint B's pad 2,
Footprint A's pad 59 is connected to Footprint B's pad 37,
Footprint A's pad 60 is connected to Footprint B's pad 36,
Footprint A's pad 62 is connected to Footprint B's pad 34,
Footprint A's pad 63 is connected to Footprint B's pad 33,
Footprint A's pad 71 is connected to Footprint B's pad 25,
Footprint A's pad 72 is connected to Footprint B's pad 24,
Footprint A's pad 74 is connected to Footprint B's pad 22,
Footprint A's pad 75 is connected to Footprint B's pad 21.

Figure 4:
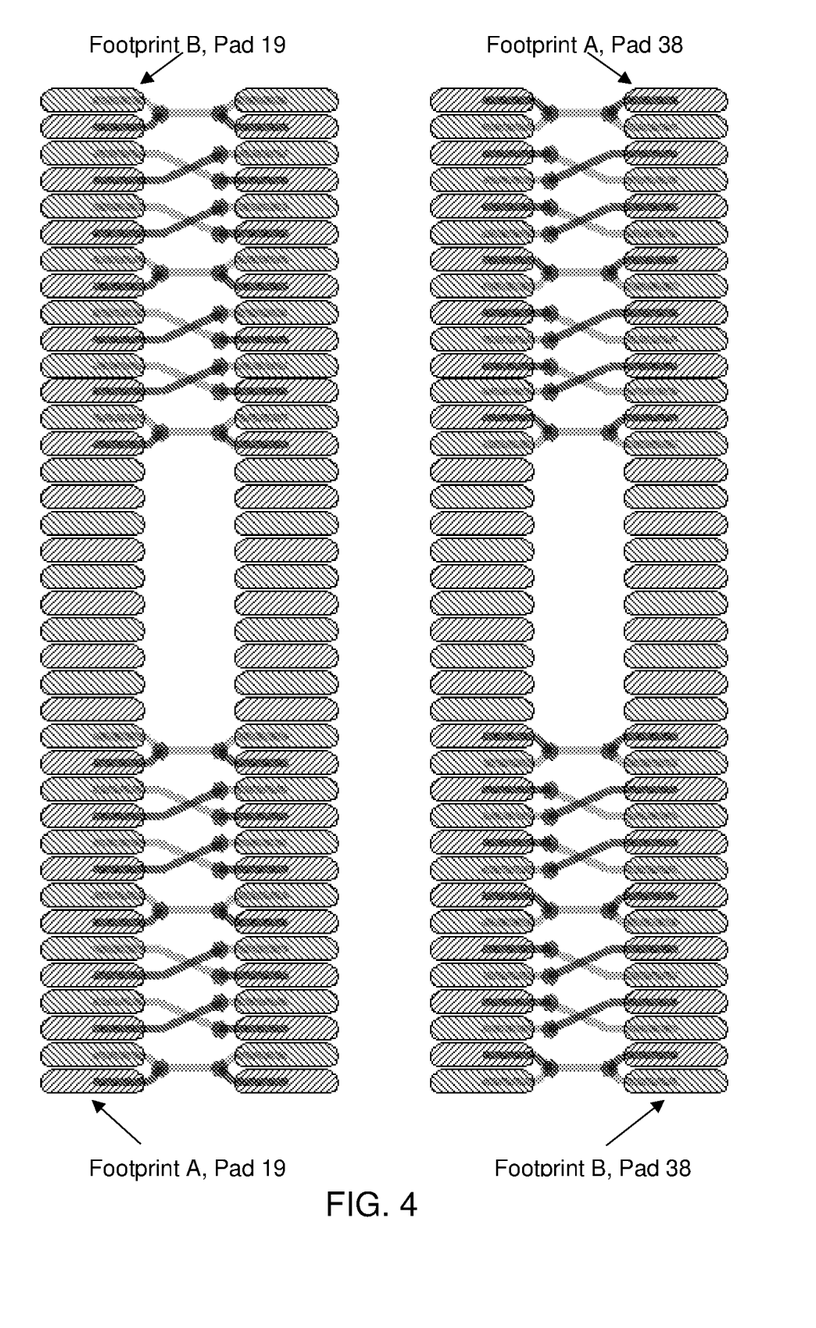
FIG. 4 is the drawing of how the two QSFP-DD electrical connectors' footprints' pads are connected through PCB traces and VIA on a PCB board (Top transparent view).
5.

7. As shown in FIG. 4, each pair of mated pads defined in Table 3 are connected through length adjustable PCB traces (shaded with light gray or dark gray) and at least one metal plated through hole VIA (shaded with dark gray dot). The PCB traces shaded in dark gray are on the top side of the PCB board and the PCB traces shaded in light gray are on the bottom side of the PCB board. The pads shaded with forward slash lines are on the top side of the PCB board, and the pads shaded with backslash lines are on the bottom side of the PCB board.

Figure 5:
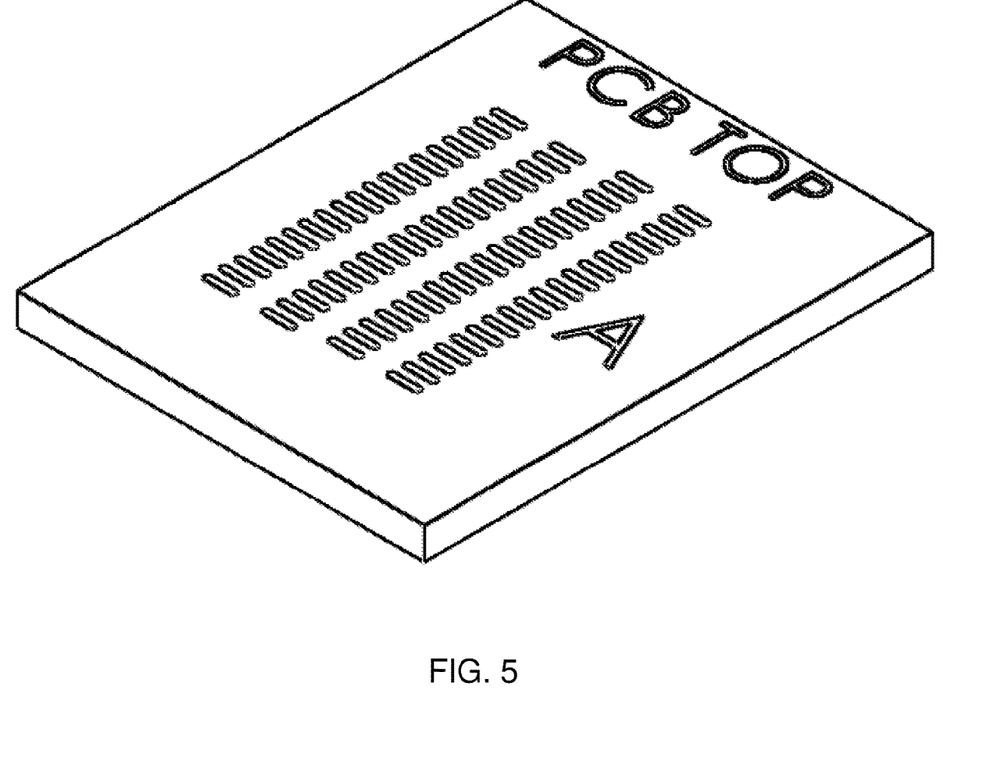
FIG. 5 is a 3D drawing of a QSFP-DD electrical connector's footprint is placed on top of a PCB board.
6.

8. QSFP-DD electrical Connector A's footprint Footprint A is placed on the top of a PCB board as shown in FIG. 5.

Figure 6:
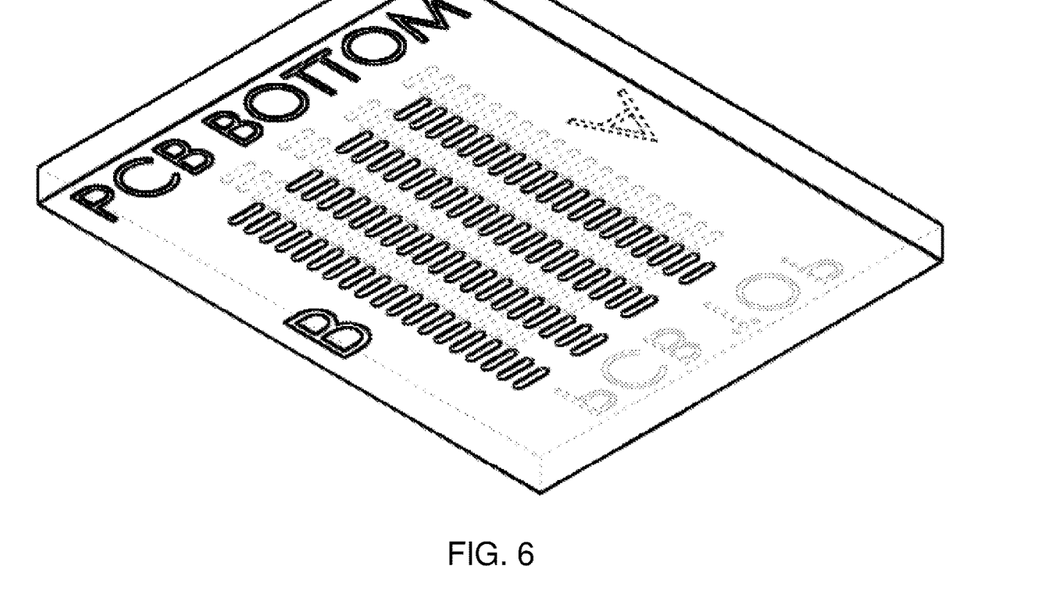
FIG. 6 is a 3D drawing of two QSFP-DD electrical connectors' footprints are placed and aligned in a special way on the opposite sides of a PCB board.
7.

9. As shown in FIG. 6 (Top Transparent View), QSFP-DD electrical Connector B's footprint Footprint B is placed on the bottom side of the same PCB board shown in FIG. 5. And the two footprints are aligned the way as shown in FIG. 3.

Figure 7:
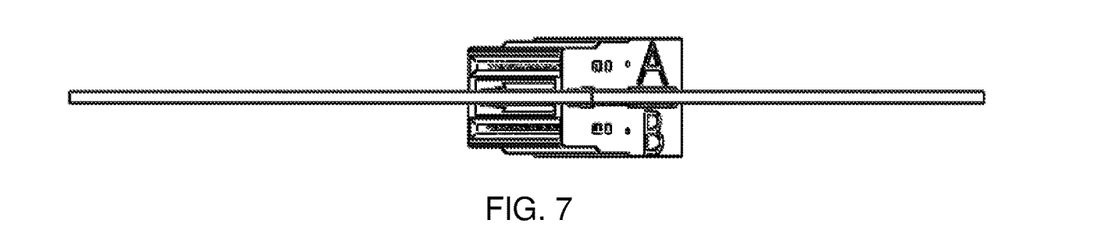
FIG. 7 is a 3D drawing of two QSFP-DD electrical connectors are soldered onto their footprints located on the opposite sides of a PCB board.
8.

10. As shown in FIG. 7, QSFP-DD Connectors' A and B are individually soldered onto their footprints' A and B which are specially aligned and placed on the opposite sides of the PCB board as the way shown in FIG. 3, FIG. 5 and FIG. 6.

Figure 8:
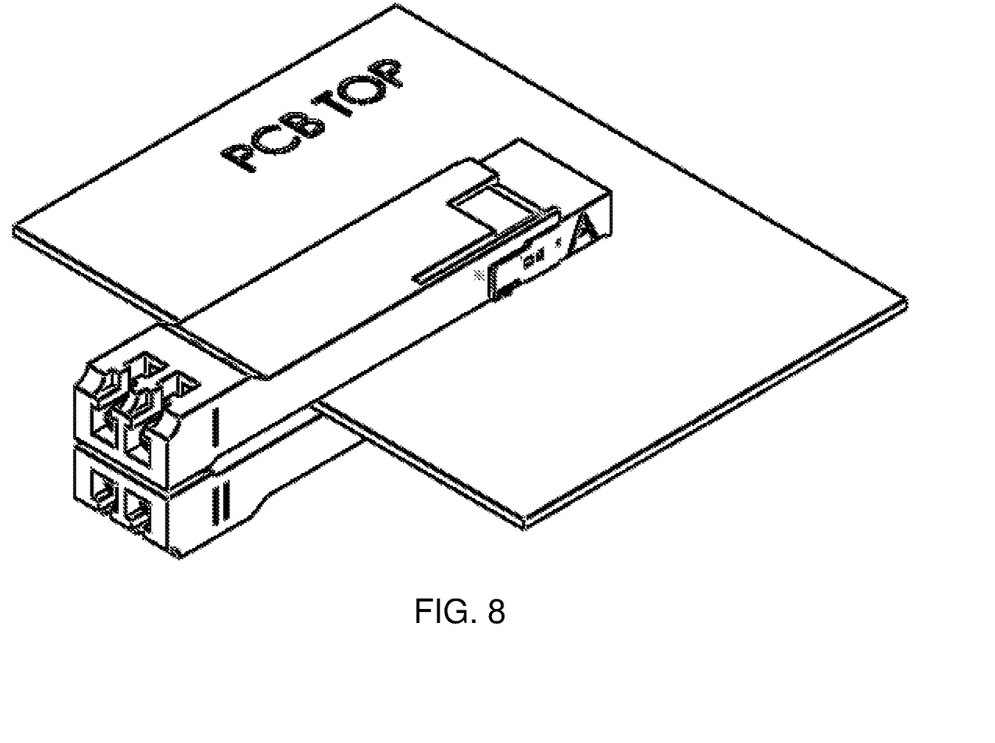
FIG. 8 is a 3D drawing of two QSFP-DD transceiver modules are plugged into their electrical connectors located on the opposite sides of a PCB board.
9.

11. As shown in FIG. 8, QSFP-DD transceiver I and transceiver II are respectively plugged into their electrical Connectors A and B mounted on the top and the bottom sides of a PCB board.

Figure 9:
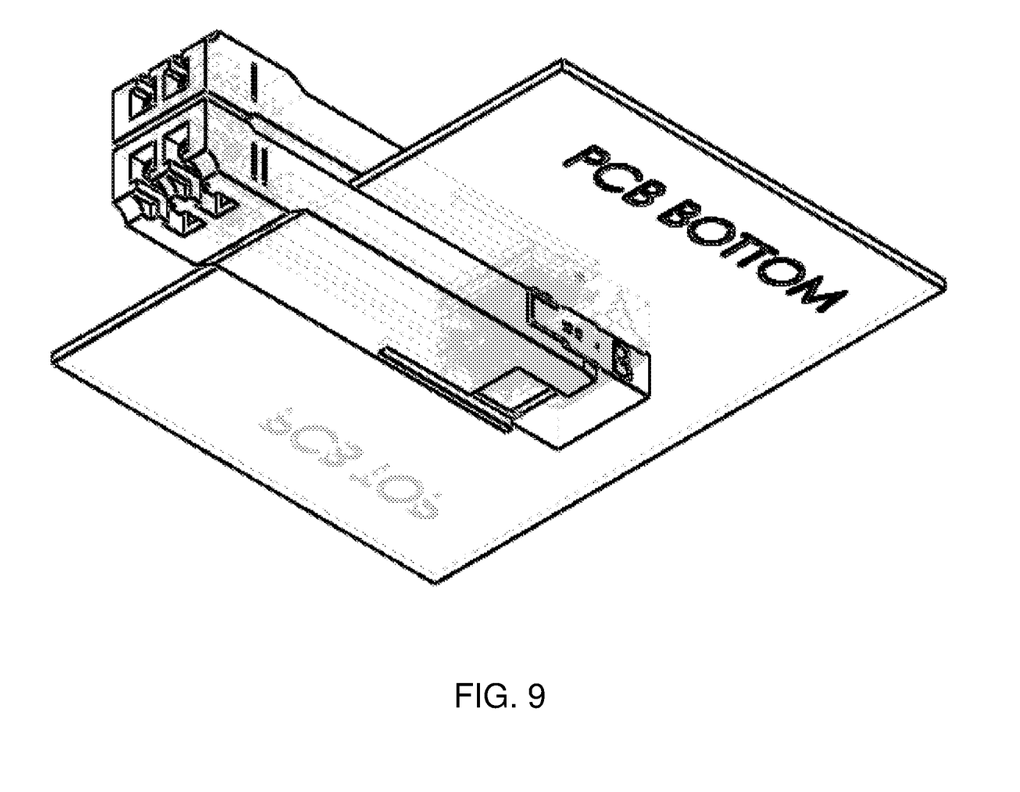
FIG. 9 is a 3D drawing of high-speed electrical signals coming from two QSFP-DD transceiver modules are connected through electrical connectors, connectors' footprints, PCB traces and VIA.
10. Table 1 is a table showing the pin assignments of high-speed signals and GND signals of the QSFP-DD electrical connector's footprint placed on top of a PCB board.
11. Table 2 is a table showing the pin assignments of high-speed signals and GND signals of the QSFP-DD electrical connector's footprint placed on bottom of a PCB board.
12. Table 3 is a table showing the connections of the pads coming from two QSFP-DD connectors footprints placed on the opposite sides of a PCB board.

12. As shown in FIG. 9, the high-speed signals (shown in Table 1.) from QSFP-DD transceiver I and the high-speed signals (shown in Table 2.) from QSFP-DD transceiver II are directly connected electrically through Connector A, Footprint A, PCB traces, VIA, Footprint B and Connector B in the shortest way.

The invention claimed is:

1. One of two QSFP-DD transceivers, QSFP-DD transceiver I or QSFP-DD transceiver II (I and II does not have to meet QSFP-DD Hardware Rev 5.1 compliance), but can instead function as a FFP-BER (Form Factor Pluggable Bit Error Rate) tester, FFP-FEC (Form Factor Pluggable Forward Error Correction) tester, or DCA (Digital Communication Analyzer); the non-compliant Form Factor Pluggable module can be of any type, including: OSFP, OSFP-XD, CFP, CFP2, CFP4, QSFP, QSFP-DD, SFP, or SFP-DD; wherein the BER Tester, FEC Tester, and DCA are capable of supporting M channels of TX (transmitting) differential electrical high-speed signals and N channels of RX (receiving) differential electrical high-speed signals, these channels are connected to the m channels of RX (receiving) differential electrical high-speed signals and n channels of TX (transmitting) differential electrical high-speed signals from another QSFP-DD transceiver (QSFP-DD transceiver I or transceiver II) acting as the Device Under Test (DUT) transceiver module; wherein the FFP-BER tester can test M specified channels of PRBS pattern signals; the FFP-FEC tester can test M specified channels of error correction schemes including: RS(528,514), RS(544,514) and more complicated error correction; and the FFP-DCA can measure M specified channels of electrical signals in terms of rising edge, falling edge, phase, pulse width, period, amplitude, and present and save all the measured information in a proper method based on the purposes of signal quality characterizations, such as waveform, eye-diagram and histogram; notably, M, N, m and n are integers ranging from 1 to 16, while m is less than or equal to M, and n is less than or equal to N.

2. A test instrument is implemented in a Form Factor Pluggable (FFP) module, as claimed in claim 1, comprises: at least one PCB paddle card serving as an electrical connector to be inserted into the receptacle of an edge connector, specifically either QSFP-DD electrical connector A or QSFP-DD electrical connector B, the structure and the connections between the FFP module, the PCB paddle card, and both edge connectors (QSFP-DD electrical connector A and connector B), as well as the connections between connector A and connector B, facilitate the transmission of M channels of TX (transmitting) differential electrical high-speed signals and N channels of RX (receiving) differential electrical high-speed signals between the FFP module (utilizing either QSFP-DD transceiver I or transceiver II) and the device under test (DUT) utilizing either transceiver I or transceiver II.

3. A testing method is established to create a testing scheme through the shortest electrical connections between the testing instrument, as described in claim 2 and a Form Factor Pluggable Module acting as a Device Under Test (DUT), the method defines a testing scheme is formed by one tester module, the electrical connector of the first form factor pluggable module, the PCB footprint of the first form factor pluggable module's electrical connector, a PCB board, the electrical connector of the second form factor pluggable module, and the PCB footprint of the second form factor pluggable module's electrical connector, along with a form factor pluggable transceiver module; wherein the scheme enables the testing of form factor pluggable transceiver modules using a test instrument designed based on the form factor pluggable module, the differential electrical high-speed signals between the form factor pluggable tester module and the form factor pluggable transceiver module are electrically connected through the first form factor pluggable module's electrical connector, the PCB footprint of the first form factor pluggable module's electrical connector, a PCB board, the PCB footprint of the second form factor pluggable module's electrical connector, and the second form factor pluggable module's electrical connector.

4. In accordance with the disclosure provided herein, extra pads can be added to the two footprints Footprint A and Footprint B providing they continue to include all or partial of the pads as described herein, and maintain the same connections' relationship as the followings: Footprint A's pad 2 is connected to Footprint B's pad 56, Footprint A's pad 3 is connected to Footprint B's pad 55, Footprint A's pad 5 is connected to Footprint B's pad 53, Footprint A's pad 6 is connected to Footprint B's pad 52, Footprint A's pad 14 is connected to Footprint B's pad 44, Footprint A's pad 15 is connected to Footprint B's pad 43, Footprint A's pad 17 is connected to Footprint B's pad 41, Footprint A's pad 18 is connected to Footprint B's pad 40, Footprint A's pad 21 is connected to Footprint B's pad 75, Footprint A's pad 22 is connected to Footprint B's pad 74, Footprint A's pad 24 is connected to Footprint B's pad 72, Footprint A's pad 25 is connected to Footprint B's pad 71, Footprint A's pad 33 is connected to Footprint B's pad 63, Footprint A's pad 34 is connected to Footprint B's pad 62, Footprint A's pad 36 is connected to Footprint B's pad 60, Footprint A's pad 37 is connected to Footprint B's pad 59, Footprint A's pad 40 is connected to Footprint B's pad 18, Footprint A's pad 41 is connected to Footprint B's pad 17, Footprint A's pad 43 is connected to Footprint B's pad 15, Footprint A's pad 44 is connected to Footprint B's pad 14, Footprint A's pad 52 is connected to Footprint B's pad 6, Footprint A's pad 53 is connected to Footprint B's pad 5, Footprint A's pad 55 is connected to Footprint B's pad 3, Footprint A's pad 56 is connected to Footprint B's pad 2, Footprint A's pad 59 is connected to Footprint B's pad 37, Footprint A's pad 60 is connected to Footprint B's pad 36, Footprint A's pad 62 is connected to Footprint B's pad 34, Footprint A's pad 63 is connected to Footprint B's pad 33, Footprint A's pad 71 is connected to Footprint B's pad 25, Footprint A's pad 72 is connected to Footprint B's pad 24, Footprint A's pad 74 is connected to Footprint B's pad 22, Footprint A's pad 75 is connected to Footprint B's pad 21.

* * * * *